United States Patent
Harris et al.

(10) Patent No.: US 7,928,762 B1
(45) Date of Patent: Apr. 19, 2011

(54) SYSTEMS AND METHODS FOR DIGITALLY DECODING INTEGRATED CIRCUIT BLOCKS

(75) Inventors: Micky R. Harris, Lompac, CA (US); Jeong-Gyun Shin, Buellton, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 12/780,476

(22) Filed: May 14, 2010

(51) Int. Cl.
  *H03K 19/173* (2006.01)
(52) U.S. Cl. ............................................. 326/38; 326/46
(58) Field of Classification Search .................. 326/8, 9, 326/37, 38, 46; 708/409, 505
See application file for complete search history.

(56) References Cited

U.S. PATENT DOCUMENTS

| | | | |
|---|---|---|---|
| 6,136,517 A | 10/2000 | Fletcher | 430/394 |
| RE40,188 E * | 3/2008 | Lofstrom | 324/750.15 |
| 7,796,759 B2 * | 9/2010 | Wuidart et al. | 380/265 |
| 2010/0070777 A1 * | 3/2010 | Salters et al. | 713/189 |

* cited by examiner

*Primary Examiner* — Don P Le
(74) *Attorney, Agent, or Firm* — Baker Botts L.L.P.

(57) ABSTRACT

Methods and systems for digitally decoding integrated circuit blocks are provided. A method for decoding integrated circuit blocks may include providing a previous block output and an increment value input to a first identification block of a first integrated circuit block, providing the output of the first identification t block and the increment value input to one of a plurality of intermediate identification blocks, and providing an output of the last of the plurality of intermediate identification blocks and the increment value input to a last identification block, wherein the output of the last identification block is indicative of the number of integrated circuit blocks.

20 Claims, 3 Drawing Sheets

SYSTEMS AND METHODS FOR DIGITALLY DECODING INTEGRATED CIRCUIT BLOCKS

TECHNICAL FIELD

The present disclosure relates to imaging, and in particular, systems and methods for digital decoding of integrated circuit blocks.

BACKGROUND

Computer chips are often built on silicon wafers using a photolithography process that creates layers of circuit patterns on the chip. First, the wafer is coated with a light-sensitive material called photoresist. Light is directed through a patterned plate called a reticle or mask to expose the resist. Following the lithographic process, the wafer is etched so that materials are removed, thus forming a three-dimensional pattern on the surface of the chip. Through additional lithographic and etching steps, subsequent layers of various patterned materials are built up on the wafer to form the multiple layers of circuit patterns on the chip.

Certain single patterns are larger than the field size of the photolithographic stepper. When this occurs, the pattern may be subdivided, where each pattern is fabricated using a photolithography process. After the fabrication process, the patterns are "stitched" to form the original pattern. One example is the fabrication of read-out integrated circuits (ROIC) for an imaging device such as, for example, focal plane arrays (FPA). FPAs are image sensing devices that include light-sensing pixels at the focal plane of a lens.

Currently, in order to determine the number of stitched computer chips, or dice, on the silicon wafers, pads are used. The pads may be bonded externally to each die and may be in communication with one or more controllers via, for example, a bus of wires. Based on the received communication from the pads, the controller may determine how many stitched dice are in use. However, the additional bus of wires associated with each die requires more "real estate" on the wafer and add to the complexity of the circuitry.

SUMMARY

The present disclosure provides techniques for digital decoding integrated circuit blocks that substantially eliminates or reduces at least some of the disadvantages and problems associated with previous methods and systems.

In some embodiments, an integrated circuit device is provided. The integrated circuit may include a plurality of integrated circuit blocks, each of the plurality of the integrated circuit blocks including an identification block. Each of the identification blocks may include a previous block input and an increment value input. In some embodiments, the identification block of each of the integrated circuit blocks is configured to generate an output based at least on the inputs received from the previous block and the increment value input, wherein the output of each of the integrated circuit blocks except for the last of the integrated circuit blocks is provided to a next one of the integrated circuit blocks as the previous block input.

In other embodiments, a method for decoding integrated circuit blocks is provided. The method may include steps for providing a previous block output and an increment value input to a first identification block of a first integrated circuit block, providing the output of the first identification t block and the increment value input to one of a plurality of intermediate identification blocks; and providing an output of the last of the plurality of intermediate identification blocks and the increment value input to a last identification block, wherein the output of the last identification block is indicative of the number of integrated circuit blocks.

In some embodiments, a system is provided. The system may include a plurality of integrated circuit block and a controller associated with the integrated circuit blocks. Each of the plurality of the integrated circuit blocks may include an identification block, where each of the identification blocks may include a previous block input and an increment value input. In some embodiments, the identification block of each of the integrated circuit blocks is configured to generate an output based at least on the inputs received from the previous block and the increment value input, wherein the output of each of the integrated circuit blocks except for the last of the integrated circuit blocks is provided to a next one of the integrated circuit blocks as the previous block input. The controller may be configured to receive the output of the last of the integrated circuit blocks and based on the received output, provide communication signals to each of plurality of integrated circuits blocks.

Technical advantages of certain embodiments of the present disclosure include reducing the number of bus of wires and additional wafer space needed to determine the number of integrated circuit blocks on a wafer. Further, the technique of the present disclosure provides an identifier that uniquely distinguishes each of the integrated circuit blocks in a wafer without additionally circuitry.

Other technical advantages will be readily apparent to one skilled in the art from the following figures, descriptions, and claims. Moreover, while specific advantages have been enumerated above, various embodiments may include all, some or none of the enumerated advantages.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1A:
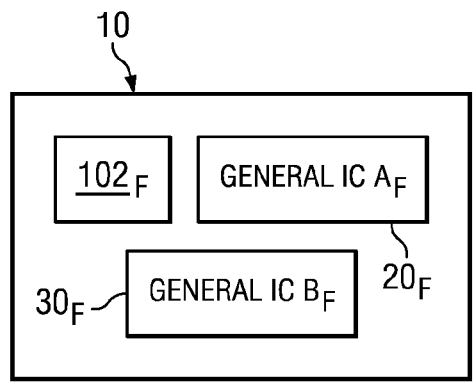
FIG. 1A illustrates an example reticle having a multiple integrated circuit patterns, in accordance with certain embodiments of the present disclosure.
Figure 1B:
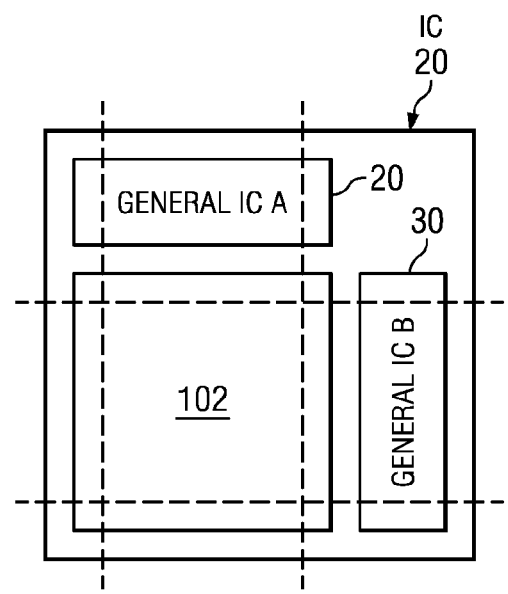
FIGS. 1B and 1C illustrate example integrated circuits configured from the reticle of FIG. 1A, in accordance with embodiments of the present disclosure.
Figure 1C:
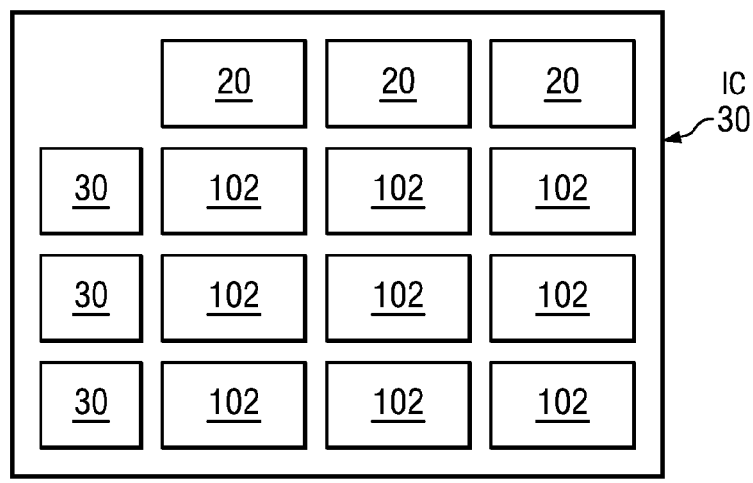
Figure 2:
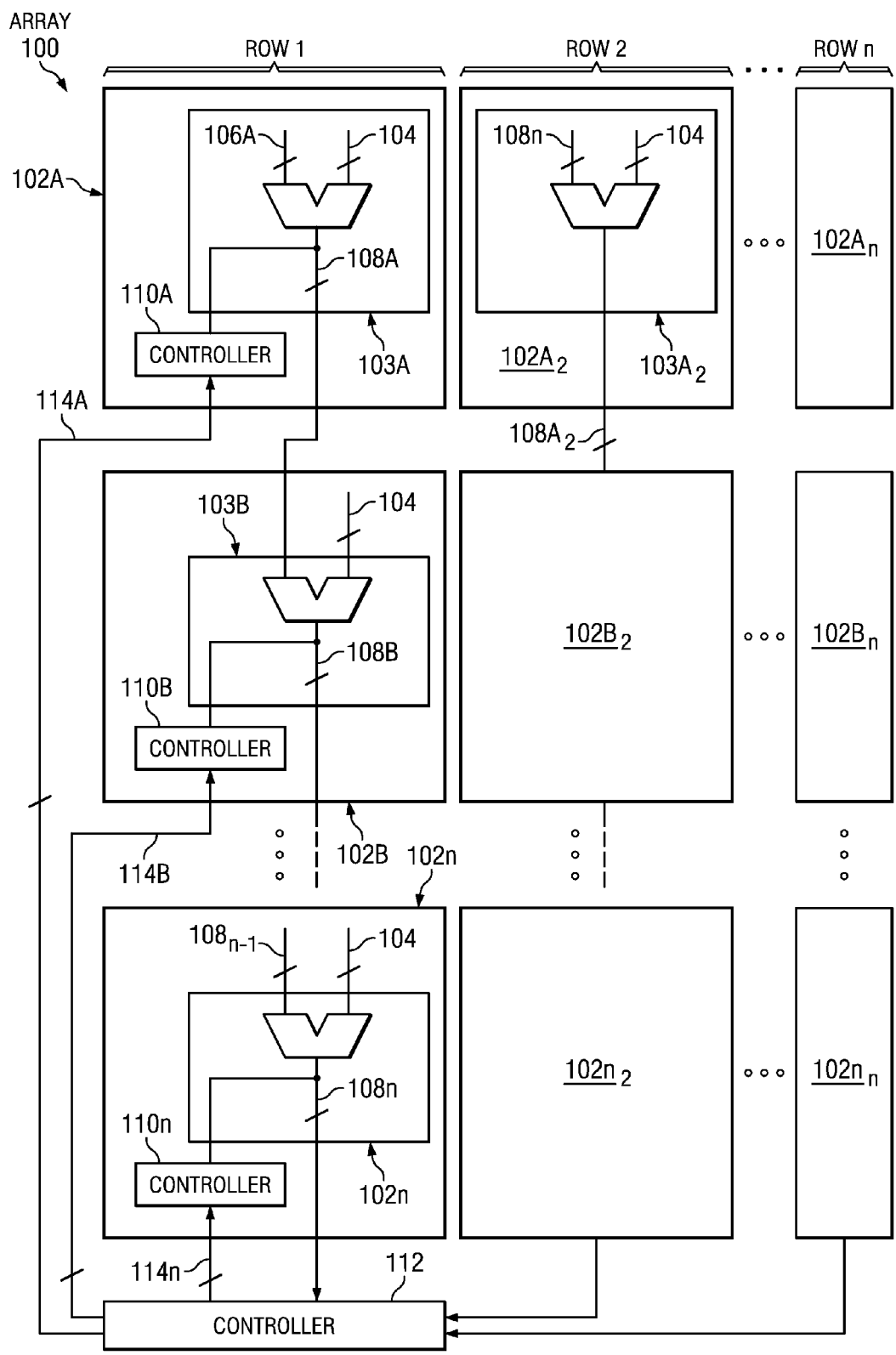
FIG. 2 illustrates an example integrated circuit array configured to decode each of the integrated circuits, in accordance with certain embodiments of the present disclosure.
Figure 3:
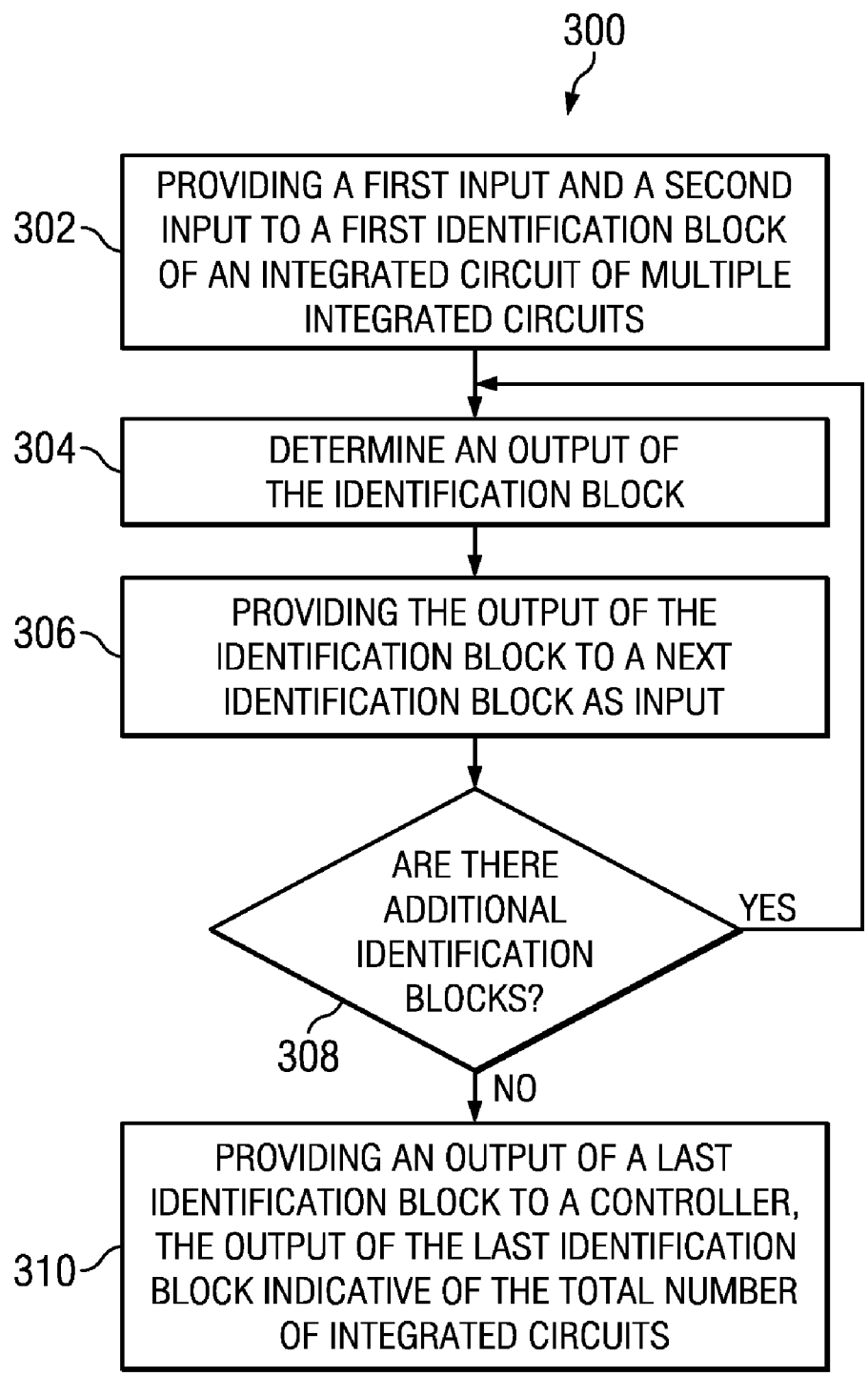
FIG. 3 illustrates an example technique method for decoding integrated circuit blocks, in accordance to certain embodiments of the present disclosure.

Preferred embodiments and their advantages are best understood by reference to FIGS. 1 through 3, wherein like numbers are used to indicate like and corresponding parts.

FIG. 1A illustrates an example reticle 10 used in the fabrication process of an integrated circuit (IC), in accordance with certain embodiments of the present disclosure. Reticle 10 may include discrete, multiple integrated circuit fields that may be used to form an integrated circuit. For example, reticle 10 may include general IC fields $A_F$, $B_F$, and $102_F$. While reticle 10 shows three IC fields, it is understood that reticle 10 may include any number of IC fields.

Each of the fields of reticle 10 may include pattern of operative structures that may perform a specific functionality of the integrated circuit. For example, general IC fields $A_F$ and $B_F$ may be for a multiplexer, a buffer, an amplifier, a controller, and/or any other functional IC component known in the art. As another example, if integrated circuit is an imaging device (e.g., a focal plane array, a charged-couple device, etc.) IC field $102_F$ may be a readout cell that includes an array of cells, where the array corresponds to the number of pixels to be imaged. In some embodiments, the IC field $102_F$ may each include substantially the same or identical circuitry pattern, such as a readout IC (ROIC) implementation, as described in more detail below with respect to FIG. 2. In a focal plane array implementation, each integrated circuit block 102 formed from IC field $102_F$ may correspond to a pixel to be imaged. The resulting circuitry, integrated circuit blocks 102, may depend on the specifics of the imaging technology and the semiconductor processing technology employed, e.g., digital and/or analog CMOS, CCD, etc.

Using the fields of reticle 10 and fabrication techniques known in the art, an integrated circuit may be formed. Referring to FIG. 1B, an example integrated circuit 20 is imaged by reticle 10 of FIG. 1A is shown, in accordance to certain embodiments of the present disclosure. Although FIG. 1B shows a specific placement of the ICs formed using IC fields $A_F$, $B_F$, and $102_F$, it is noted that the IC may include any configuration of IC fields $A_F$, $B_F$, and/or $102_F$ depending on the implementation. For example, while IC A is placed above IC 102, it is noted that IC A may be arranged at another position (e.g., below IC 102, to the side of IC 102, etc.). Thus, the resulting IC A, B, and/or 102 from the fabrication process using IC fields $A_F$, $B_F$, and $102_F$ may be arranged in any manner suitable for the desired implementation.

In some respect, IC fields $A_F$, $B_F$, and/or $102_F$ may include a large number of identical small scale circuit structures which repeat in one or two dimensions. This allows the circuit pattern to be scaled without changing the overall architecture, as shown in FIG. 1C. For example, IC 30 may be a focal plane array that desires a larger array of readout cells. To achieve this, IC fields $A_F$, $B_F$, and $102_F$ may be imaged more than once in one or two dimensions. As shown in FIG. 1C, IC fields $A_F$ and $B_F$ are imaged three times forming ICs A and ICs B. The multiple fabrication of IC fields $A_F$ and $B_F$ extends the corresponding circuitry in one dimension (e.g., IC A extending the circuitry horizontally and IC B vertically). IC field $102_F$ is imaged nine times, extending the area of the readout cell by a corresponding factor of nine. Thus, the integrated circuit blocks 102 formed by IC fields $102_F$ may be "stitched" together in a two-dimensional array such that the number of blocks corresponds to the number of pixels to be imaged. Thus, integrated circuit blocks 102 may be scaled in a two-dimensional manner by merely repeating the block pattern to increase the number of pixels and hence the focal plane size of the imaging device. Further details of the fabrication of IC 10 or 20 of FIGS. 1A and 1B are described in, U.S. Pat. No. 6,136,517 by Christopher L. Fletcher, herein incorporated by reference in its entirety.

In order to determine the number of ICs stitched together, an identification block may be provided. As shown in FIG. 2, an example identification block 103 is provided for each integrated circuit blocks 102, in accordance with certain embodiments of the present disclosure. It is noted that while FIG. 2 shows integrated circuit blocks 102 arranged in a two-dimensional array 100 (e.g., a matrix), integrated circuit blocks 102 may also be arranged in a one-dimensional array (e.g., a row) for some implementations.

In some embodiments, each multiple integrated circuit block 102 may include substantially the same or identical circuit pattern such as, for example, a ROIC implementation, where the multiple integrated circuit blocks 102 make up a large number of readout cells of an imaging device. To decode the number of readout cells, each integrated circuit block 102 may include an identification block 103. Decoding may refer to identifying a total number of integrated circuit blocks 102 in the array. In the same or alternative embodiments, decoding may refer to assigning a unique identifier for each of integrated circuit blocks 102, as described in more detail below.

In some embodiments, identification block 103 is a digital adder (e.g., multiple-bit adder) that receives two inputs and sums the input to produce an output. For example, for block 102A, which is a first block in Row 1 of array 100, inputs 104 and 106A may be provided to identification block 103A. Input 104 may set be tied to $V_{dd}$, which provides input value of '1' and input 106A may be tied to ground, which provides in input value '0', although it is noted other values may be used. The digital adder of identification block 103 may sum its inputs, and produce an output 108A. Output 108A may subsequently be provided as one input to identification block 103B of integrated circuit block 102B.

At identification block 103B, a second input may also be provided such as, for example, input 104. In particular, the value of input 104 provided as input to identification block 103A may also be provided to all identification blocks 103. Input 104 may be a predetermined increment value that may increase the output of each adder of identification blocks 103 by the same amount. For example, if input 104 is '1', the output of each identification block is the output of the previous identification block 103 incremented by '1' (with a result of '2' at block 103B).

As noted above, the output of identification blocks 103 may be used as an input of a next identification block 103. In some embodiments, the output of the last integrated circuit block 102 of a row or a column may identify the number of blocks within the particular row or column. For example, referring again to FIG. 2, if the output of identification block 103A is '1', and the increment value of input 104 is '1' at identification block 103B, the output 103B is '2', which is provided to identification block 103C, and so on. Thus, at the last integration circuit block 102n, the output 108n is equal to the number of any previous integration circuit blocks and the current integration circuit block, 102n, e.g., the number of integration circuit blocks for the row.

In some embodiments, the output of the last identification block 103 of each row or column, may be provided to controller 112 associated with integrated circuit blocks 102. Controller 112 may include any system, device, apparatus, firmware, and/or application (e.g., a program of instructions executable by a processor, for example, a processor associated with controller 112) configured to send control signals via communication signal 114 to integrated circuit blocks 102. In some embodiments, controller 112 may be integral to array 100, e.g., fabricated on the same wafer as array 100. In other embodiments, 112 may be remote from array 100 and may be coupled communicatively to array 100 via, for example, communication signals 114. In some embodiments, controller 112 may be configured to readout data from 100. Controller 112 may also be configured to determine the clocking and signal processing signals for array 100. Controller 112 may also be configured to receive as input the output 108n, which may indicate the number of integrated circuit blocks 102 in Row 1, where controller 112 may set the inputs for subsequent rows of array 100. For example, controller 112 may set the inputs for identification block 103$A_2$ of integrated circuit block 102$A_2$. In one embodiment, controller 112 may provide the output of identification block 103$n$, output 108$n$, and input 104 to identification block 103$A_2$. If output 108$n$ equals a value x, e.g., there are x number of integrated circuit blocks 102 in Row 1, and input 104 is '1', the output of identification block 103$A_2$ is equal to 108$n$+1. By providing the output of the last integrated circuit block 102 of a previous row, and by incrementing the output by the predetermined increment value using input 104, the output 108 of each integrated circuit block 102 may have a unique value.

In some embodiments, the output 108 of each identification block 103 may be sent to a local controller 110 associated with the particular identification block 103. Output 108 may also be identifier because the output of each identification block 103 yields a unique value for the particular integrated circuit 102. For example, if increment input 104 is equal to '1', the output of identification block 103A is 1 (if input 106A is '0'), the output of identification block 103B is '2', the output of identification block 103$n$ is 'n', the output of identification block 103$A_2$ is 'n+1', and so forth. Controller 112 in communication with local controller 110 may use output 108 as a unique address for each integrated circuit 102. For example, using output 108 as an identifier or an address, controller 112 may access each integrated circuit block 102 for acquiring data at each integrated circuit block 102. In one embodiment, controller 112 may communicate with local controllers 110 via communication signals 114. Controller 112 may send a command with a specific identifier to at least some or all of local controllers 110 of array 100. Local controller 110 may receive the command and may determine if the identifier is equal to the specific address of the integrated circuit block 102 assigned based on the output of its identification block 103. If the specific identifier sent by controller 112 does not match, no action by integrated circuit block 102 is required. If the specific address sent by controller is equal to the address of the integrated circuit block 102, local controller 110 may implement the commands of controller 112 accordingly.

Referring to FIG. 3, a method for decoding integrated circuit blocks, in accordance with certain embodiments of the present disclosure is provided. At step 302, a first input and a second input may be provided to a first integrated circuit block 102 of multiple integrated circuit blocks 102, and in particular to an identification block 103 associated with the first integrated circuit block 102. In some embodiments, the multiple integrated circuit blocks 102, each including substantially the same or identical circuitry, may be arranged in a one-dimensional or a two-dimensional array. The first input 104 provided may be an increment input value with a value of '1' and the second input 106A provided may equal to '0'. While the present example discloses an increment value equaling '1' any value may be considered based on the implementation.

At step 304, the output 108 of the first identification block 103 is determined. In some embodiments, first identification block 103 may include an adder configured to sum its inputs. For example, if a first input is '0' and the increment value input is '1', the output of the identification block is '1'.

Next at step 306, the output determined in step 304 may be provided to a second identification block 103 of a second integrated circuit block 102 as an input. In some embodiments, the same increment input value 104 provided to the first identification block 103 may also be provided to the second identification block 103.

At step 308, method 300 may determine if there are any additional intermediate identification blocks. If one or more intermediate identification blocks exist, method may proceed to step 304 to determine the output. In there are no intermediate identification blocks, method 300 may proceed to step 310.

At step 310, the output of the last identification block 103 of the last integrated circuit block of the row (e.g., integrated circuit block 102$n$ of Row 1 of FIG. 2) may be provided to controller 112. In some embodiments, the output may indicate the total number of integrated circuit blocks in the row or column of a one-dimensional array. For a two-dimensional array, the output received by the controller 112 may be provided as input to the first integrated circuit block of a subsequent row or column of the array. For example, output 108$n$ of Row 1 may be provided to controller 112 and may be provided as input to integrated circuit block 102$A_2$ of Row 2. Steps 302 through 308 may be repeated until a total number of integrated circuit blocks 102 of array 10 is identified.

In some embodiments, the output of steps 304 and/or 310 may be provided to a respective local controller 110 associated with the respective identification blocks. The outputs may be unique identifier that distinguishes each integrated circuit block 102 of the array. In particular, the value of the outputs from step 304 and 308 may be used as an address as the output is not the same for integrated circuit 102 in array 100. Thus, controller 112 may access each integrated circuit block 102 by knowing the address or the output of the identification block 103.

While method 300 contemplates multiple identification blocks configured in a row, method 300 may also be applied to multiple identification blocks in a column. Alternatively, method 300 may be used to determine the number of integrated circuit blocks configured in an array. In some embodiments, method 300 may include a step for providing the output of the last identification block of a first row as input to a first identification block in a second row. Some or all steps 304 through 310 may be implemented and a total output of row may be provided to controller 112. In the same or alternative embodiments, a total number of integrated circuit blocks 103 in array 100 may be provided by the last identification block 103 of the last row/column of array 100.

Although the figures and embodiments disclosed herein have been described with respect to information handling systems, it should be understood that various changes, substitutions and alternations can be made herein without departing from the spirit and scope of the disclosure as illustrated by the following claims.

What is claimed:

1. An integrated circuit device, comprising:
   a plurality of integrated circuit blocks, each of the plurality of the integrated circuit blocks comprising an identification block;
   each of the identification blocks comprising:
      a previous block input;
      and an increment value input; and
   the identification block of each of the integrated circuit blocks is configured to generate an output based at least on the inputs received from the previous block and the increment value input, wherein the output of each of the integrated circuit blocks except for the last of the integrated circuit blocks is provided to a next one of the integrated circuit blocks as the previous block input.

2. The integrated circuit device of claim 1, wherein for a first identification block, the previous block input is zero.

3. The integrated circuit device of claim 1, wherein the output of the last of the integrated circuit blocks is indicative of the number of integrated circuit blocks.

4. The integrated circuit device of claim 1 further comprising a controller communicatively coupled to the plurality of integrated circuit blocks, the controller configured to:
- receive an output of the last of the integrated circuit; and
- based on the received output, send communication signals to each of plurality of integrated circuits.

5. The integrated circuit device of claim 1, wherein the output of each identification block is a unique identifier for the associated integrated circuit block.

6. The integrated circuit device of claim 5, wherein the identifier is an address for the associated circuit block.

7. The integrated circuit device of claim 1, wherein the identification block comprises an adder.

8. The integrated circuit device of claim 1, wherein the plurality of integrated circuit blocks are configured in an array.

9. The integrated circuit device of claim 1, wherein each of the integrated circuit blocks comprises substantially the same circuitry.

10. A method for decoding integrated circuit blocks, the method comprising:
- providing a previous block output and an increment value input to a first identification block of a first integrated circuit block;
- providing the output of the first identification block and the increment value input to one of a plurality of intermediate identification blocks; and
- providing an output of the last of the plurality of intermediate identification blocks and the increment value input to a last identification block, wherein the output of the last identification block is indicative of the number of integrated circuit blocks.

11. The method of claim 10, wherein each identification blocks comprise an adder.

12. The method of claim 10, wherein for the first identification block, the previous block input is zero.

13. The method of claim 10, wherein the output of each identification block is a unique identifier for the associated integrated circuit block.

14. The method of claim 13, wherein each of the unique identifiers for the associated integrated circuit block comprises an address.

15. The method of claim 10, further comprising providing the output of the last identification block to a controller associated with the first identification block, the plurality of intermediate identification blocks, or the last identification block.

16. A system, comprising:
- a plurality of integrated circuit blocks, each of the plurality of integrated circuit blocks comprising an identification block;
- each of the identification blocks comprising:
  - a previous block input;
  - and an increment value input;
- the identification block of each of the integrated circuit blocks is configured to generate an output based at least on the inputs received from the previous block and the increment value input, wherein the output of each of the integrated circuit blocks except for the last of the integrated circuit blocks is provided to a next one of the integrated circuit blocks as the previous block input; and
- a controller associated with the integrated circuit blocks, the controller configured to:
  - receive the output of the last of the integrated circuit blocks; and
  - based on the received output, send communication signals to each of plurality of integrated circuits blocks.

17. The system of claim 16, wherein for a first identification block, the previous block input is zero.

18. The system of claim 16, wherein the output of the last identification block is indicative of the number of integrated circuit blocks.

19. The system of claim 16, wherein the output of each identification block is a unique identifier for the associated integrated circuit block.

20. The system of claim 16, wherein the identification block comprises an adder.

* * * * *